US010847994B2

(12) United States Patent
Mohan et al.

(10) Patent No.: US 10,847,994 B2
(45) Date of Patent: Nov. 24, 2020

(54) DATA CENTER POWER DISTRIBUTION SYSTEM

(71) Applicant: Seagate Technology LLC, Cupertino, CA (US)

(72) Inventors: Hemant Mohan, Pune (IN); Deepak Nayak, Mumbai (IN); Rajesh Maruti Bhagwat, Pune (IN)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 45 days.

(21) Appl. No.: 16/355,504

(22) Filed: Mar. 15, 2019

(65) Prior Publication Data

US 2020/0295591 A1    Sep. 17, 2020

(51) Int. Cl.
| | |
|---|---|
| H02J 9/00 | (2006.01) |
| G06F 1/30 | (2006.01) |
| H02J 3/00 | (2006.01) |
| H05K 7/14 | (2006.01) |
| H02M 7/155 | (2006.01) |
| H02J 3/32 | (2006.01) |

(52) U.S. Cl.
CPC .................. *H02J 9/00* (2013.01); *G06F 1/30* (2013.01); *H02J 3/005* (2013.01); *H02J 3/32* (2013.01); *H02M 7/1555* (2013.01); *H05K 7/1487* (2013.01); *H05K 7/1492* (2013.01)

(58) Field of Classification Search
CPC ..... H02J 9/00; H02J 3/005; H02J 3/32; G06F 1/30; H02M 7/1555; H05K 1/1487; H05K 7/1492
See application file for complete search history.

(56) References Cited

U.S. PATENT DOCUMENTS

| | | | |
|---|---|---|---|
| 6,787,259 B2 | 9/2004 | Colborn et al. | |
| 7,561,411 B2 | 7/2009 | Johnson, Jr. | |
| 8,344,546 B2 | 1/2013 | Sarti | |
| 9,778,718 B2 | 10/2017 | Zacho | |
| 9,846,470 B2 | 12/2017 | Madsen et al. | |
| 9,882,422 B2 * | 1/2018 | Mondal ..................... | H02J 1/10 |
| 9,898,026 B2 | 2/2018 | Ewing et al. | |
| 9,899,835 B2 | 2/2018 | Mino et al. | |
| 9,918,401 B2 | 3/2018 | Leigh et al. | |
| 9,929,567 B2 | 3/2018 | Wang et al. | |
| 10,003,163 B2 | 6/2018 | Hewitt et al. | |
| 10,164,464 B1 * | 12/2018 | Ross ....................... | H02J 9/061 |

(Continued)

OTHER PUBLICATIONS

Miftakhutdinov, Rais, "Energy Saving Drives New Approaches to Telecommunications Power System", Texas Instrument Inc., www.intechopen.com, Trends in Telecommunications Technologies, ISBN 978-953-307-072-8, Published in print edition: Mar. 2010, 37 pages.

*Primary Examiner* — Dinh T Le
(74) *Attorney, Agent, or Firm* — Westman, Champlin, and Koehler, P.A.

(57) ABSTRACT

A system includes a direct current uninterruptible power supply (DC UPS) that receives an alternating current (AC) power input and provides a first DC power output. The system also includes a power distribution unit (PDU). The PDU receives the first DC power output from the DC UPS. The PDU converts the first DC power output into a second DC power output that supplies power to at least one component of information technology equipment (ITE) via a DC mating connector.

16 Claims, 8 Drawing Sheets

(56) References Cited

U.S. PATENT DOCUMENTS

2010/0042860 A1  2/2010  Kwon et al.
2011/0006607 A1  1/2011  Kwon et al.
2014/0239718 A1  8/2014  Giles

* cited by examiner

DATA CENTER POWER DISTRIBUTION SYSTEM

SUMMARY

In one embodiment, a system is provided. The system includes a direct current uninterruptible power supply (DC UPS) that receives an alternating current (AC) power input and provides a first DC power output. The system also includes a direct current power distribution unit (DC PDU). The DC PDU receives the first DC power output from the DC UPS. The DC PDU converts the first DC power output into a second DC power output that supplies power to at least one component of information technology equipment (ITE) via a DC mating connector.

In another embodiment, a method is provided. The method includes receiving an AC main power supply in a data center. The method also includes converting the AC main power supply into DC power and providing a first DC power output. The method further includes converting the first DC power output into a second DC power output. The second DC power output is provided to at least one component of ITE in the data center.

In yet another embodiment, an apparatus is provided. The apparatus includes a first device and a DC PDU. The DC PDU receives a first DC power output from the first device and converts the first DC power output into multiple different second DC power outputs. Each different second DC power output has a different DC voltage level for supplying power to different components of a plurality of components of ITE via DC mating connectors.

This summary is not intended to describe each disclosed embodiment or every implementation of the data center power distribution system. Many other novel advantages, features, and relationships will become apparent as this description proceeds. The figures and the description that follow more particularly exemplify illustrative embodiments.

DETAILED DESCRIPTION

Embodiments described below relate to a data center power distribution system in which direct current (DC) power distribution components are employed to reduce power conversion from alternating current (AC) power to DC power, which results in space saving by elimination of AC to DC and DC to AC power conversion components. Prior to providing details regarding components of the power distribution system, a description of an illustrative operating environment is provided below.

Figure 1:
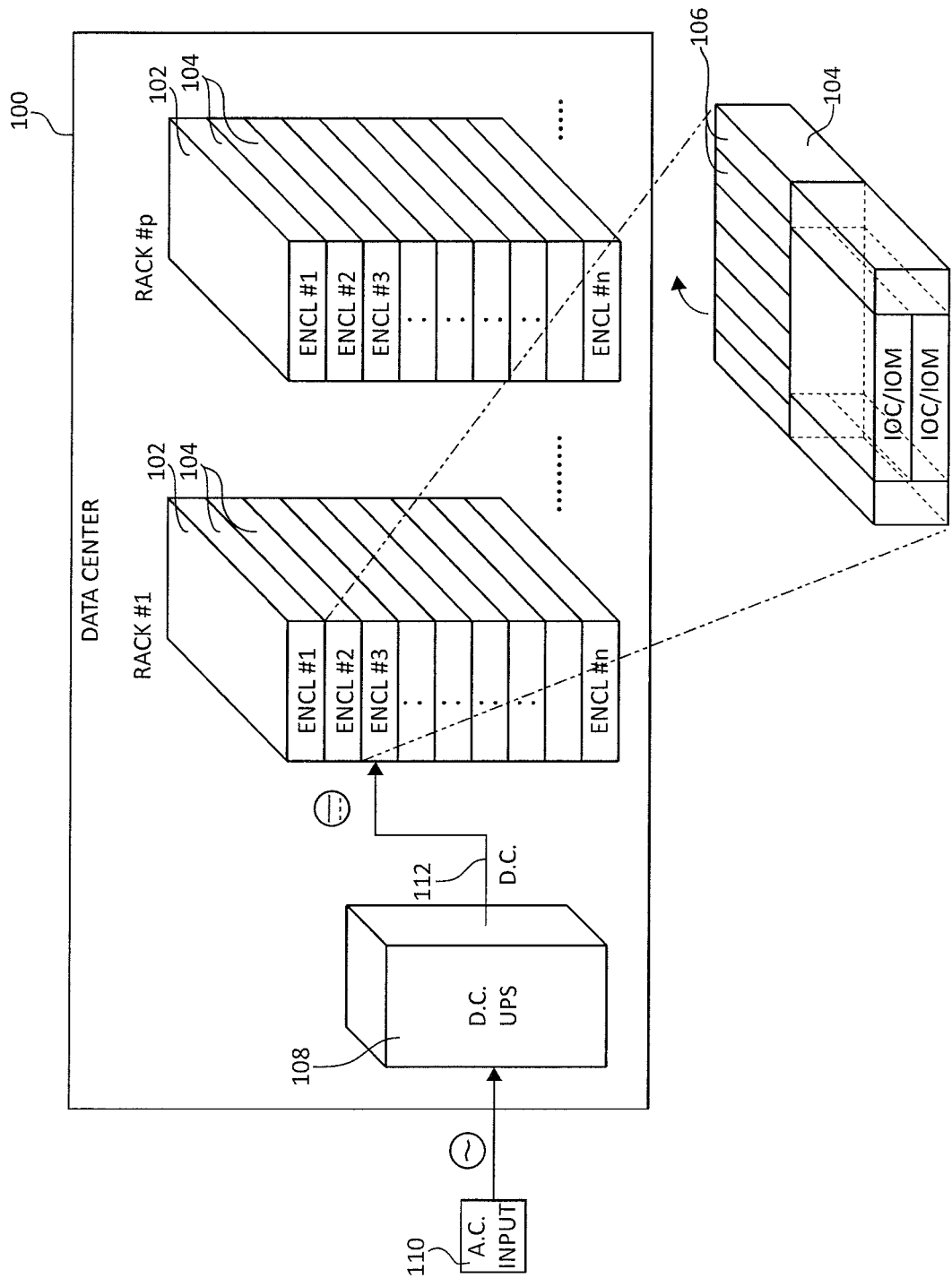
FIG. 1 is a diagrammatic illustration of an example data center in which power distribution system embodiments of the disclosure may be employed.

FIG. 1 shows an illustrative operating environment in which certain embodiments disclosed herein may be incorporated. The operating environment shown in FIG. 1 is for illustration purposes only. Embodiments of the present disclosure are not limited to any particular operating environment such as the operating environment shown in FIG. 1. Embodiments of the present disclosure are illustratively practiced within any number of different types of operating environments.

It should be noted that the same reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

FIG. 1 is a diagrammatic illustration of an example data center 100 in which power distribution system embodiments of the disclosure may be employed. Data center 100 may include multiple racks 102, with each rack 102 including chassis or enclosures 104, which may be stacked vertically, for example, in the rack 102 frame. A chassis or enclosure 104 may include multiple bays or slots 106 for housing data storage drives (DSDs) such as hard disk drives (HDDs), solid state drives (SSDs), hybrid drives, etc. In addition to the DSDs, some chassis or enclosures 104 may include compute modules referred to as controllers. Further, network switches or cards may also be included in some chassis or enclosures 104. A combination of the controller, DSDs and network switches or cards inside the chassis or enclosure is generally referred to as information technology equipment (ITE).

An explosive increase in the demand for data has resulted in a concomitant increase in the number, size (e.g., capacity) and complexity of data centers such as 100 and data center 100 components such as racks 102, chassis or enclosures 104 and DSDs.

At the DSD (e.g., HDD) level, the increase in the demand for data has resulted in increasing areal density and capacity per HDD, which is achieved through higher track per inch (TPI) numbers. TPIs for HDDs have already crossed 680 kilo (K) and are fast approaching 1 million (M).

At the chassis or enclosure 104 level, the increase in the demand for data has resulted in including more HDDs into each enclosure 104. This is measured in terms of drive density, which is drives/RU of space, where RU stands for 1 rack unit. Recently, drive densities have increased from about 15 to more than 25.

The combination of high-capacity, high-TPI HDDs in high-density chassis or enclosures 104 presents design challenges, especially for the high-density chassis or enclosures 104 meant to house 1M TPI HDDs. The design-related challenges may include:

1. Providing enhanced cooling entailed as a consequence of decreased (e.g., up to single-digit millimeter levels) inter-HDD space. This may call for chassis cooling fans (CCFs) in the enclosures 104 rotating at higher speeds, and thereby increasing vibrational energy and acoustic noise.
2. Higher TPI places a severe strain on HDD servo-system stability, affecting performance. Smaller inter-track space may increase all track mis-registration (TMR) figures (namely, read, write, and especially, write-to-read). Both repeatable runout (RRO) and non-repeatable runout (NRRO) would increase.
3. Severely reduced HDD throughput (for example, by as much as 95% for HDDs close to CCFs) due to:
i) The compounded effect of (1) and (2) above. High vibrational energy from CCFs impacts track-following (resulting in frequent read and/or write inhibits), increases seek-settle time, and makes staying within an on-cylinder limit more difficult.
ii) A change in the HDD's filler medium from air to helium has increased HDD sensitivity to acoustic noise.

As indicated above, CCFs are for inclusion within enclosures such as 104 and therefore will occupy enclosure space, which comes at a cost of HDD real estate. Further, many data centers currently employ power distribution systems in which there is double power conversion from DC to AC in an uninterruptible power supply (UPS) and from AC back to DC in the front-end power supply that supplies power to ITE such as servers, groups of drives, etc. The front-end power supply along with the CCFs together occupy substantial space within the enclosures 104.

To reduce power conversion from DC to AC or AC to DC and to save enclosure space, embodiments of the disclosure employ a direct current (DC) UPS that provides a first DC output, and a DC power distribution unit (DC PDU) that receives the first DC output from the DC UPS. The DC PDU converts the first DC output received from the DC UPS into multiple second DC outputs, with each different second DC output supplying power to different components of a plurality of components of ITE via DC mating connectors.

In the embodiment of FIG. 1, a DC UPS is denoted by reference numeral 108. DC UPS 108 receives AC power from an AC input 110 and provides a first DC power output 112. Components within DC UPS 108 and the use of a DC PDU to supply power to ITE are described below in connection with FIGS. 2A and 2B.

Figure 2A:
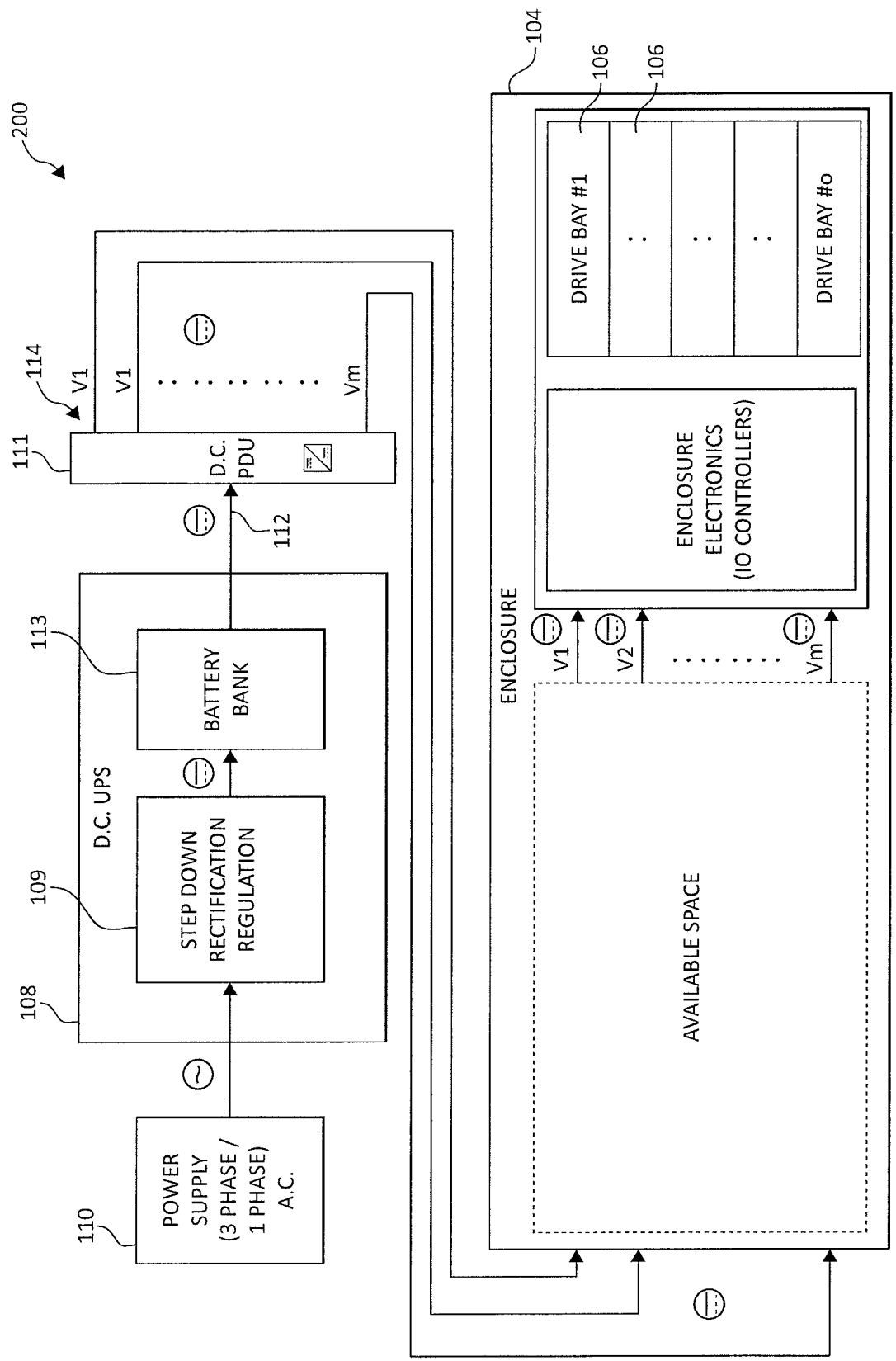
FIG. 2A is a simplified block diagram of a data center power distribution system in accordance with one embodiment.

FIG. 2A is a simplified block diagram of a data center power distribution system 200 in accordance with one embodiment. Power distribution system 200 includes DC UPS 108, which is directly coupled to a bank of DC PDUs with the help of electrical connectors. As can be seen in FIG. 2A, DC UPS 108 includes a step down rectification and regulation component 109 and a battery bank 113. In FIG. 2A, a single DC PDU 111, of the bank of DC PDUs, is shown directly coupled to DC UPS 108. DC PDU 111 receives first DC power output 112 from DC UPS 108. DC PDU 111 converts the first DC power output 112 into multiple different second DC power outputs 114, with each different second DC power output providing a voltage level (e.g., V1 through Vm in FIG. 2A) suitable for supplying power to a component of the ITE within enclosure 104. Conversion from the first DC power output 112 to the multiple second DC power outputs 114 is carried out by one or more DC to DC converters (not shown in FIG. 2A) included within the DC PDU 111. Details regarding components of DC PDU 111 in accordance with one embodiment are provided below in connection with FIG. 2B.

Figure 2B:
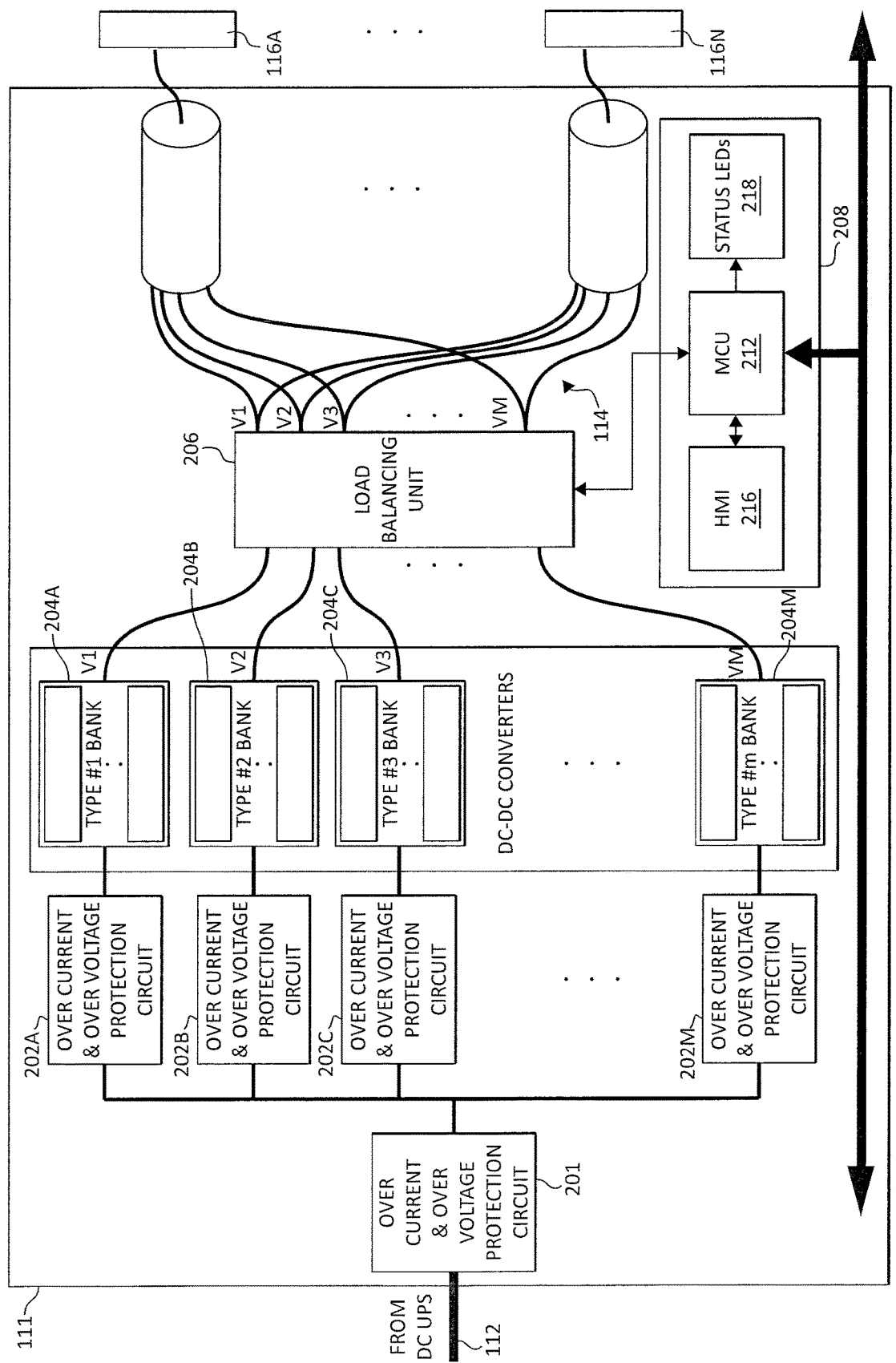
FIG. 2B is a simplified block diagram of a power distribution unit in accordance with one embodiment.

FIG. 2B is a block diagram showing components within DC PDU 111 in accordance with one embodiment. DC PDU 111 includes a DC PDU system over-current and over-voltage protection circuit 201 and multiple individual over-current and over-voltage protection circuits 202A-202M. DC PDU 111 further includes multiple banks of DC-DC converters 204A-204M, a load balancing unit 206 and control circuitry 208.

As noted above, DC-PDU 111 takes in first DC power output 112 from the DC-UPS (not shown in FIG. 2B) and outputs a range of second DC voltages (V1, V2, . . . , Vm) 114 for supplying power to ITE components downstream through customized DC mating connectors. Female portions of the DC mating connectors are shown in FIG. 2B and are represented by reference labels 116A . . . 116N.

DC Power is input to the banks of DC-DC converter assemblies 204A-204M of various types through the system-wide over-current and over-voltage protection circuit 201 and the multiple individual over-current and over-voltage protection circuits 202A-202M.

Depending on the DC power (voltage) a particular ITE component (e.g., server mother-board, add-in card, board management controller (BMC), input/output controller (IOC)/input/output module (IOM), central processing unit (CPU)-complex, mid/back plane, disc-bay assembly, etc.) is designed to use, and the degree of electrical isolation suitable for the particular ITE component, the DC-PDU 111 implements a variety of DC-DC converter types 204A-204M:

Type #1 (204A): Multi-phase Buck switching regulators (multiple outputs at high conversion efficiency)
Type #2 (204B): ǎuk converters (inductor-less, capacitor-driven operation)
Type #3 (204C): Push-pull width-modulated converters (multiple outputs at steady currents and high power, with DC isolation)
Type #m (204M): Flyback converters (low-power DC load components).

It should be noted that the above-listed types of DC-DC converters are merely examples, and any suitable DC-DC converter types may be used in different embodiments.

The range of second DC Voltage outputs (V1, V2, . . . , Vm) 114 from the above-listed DC-DC converter type assemblies 204 are provided to load balancing unit 206. Load balancing unit 206 includes combination(s) of voltage/current and/or power metering, limiting, control, sequencing and/or distribution circuits to achieve load balance, and is controlled by an on-board MCU (microprocessor/microcontroller) 212 block. Load balancing unit 206 and MCU 212 may together implement one/more of the following features:

In-rush current and trip control by programmable power sequencing
   of the DC mating connector outlets 116A-116N
   of each DC voltage (Vm) in each DC mating connector outlet 116A-116N
Programmable balancing of load power outgo
Remote (via communication channel 214) and local (via human machine interface (HMI) 216, status LEDs 218) sensing, recording, monitoring, indication, feedback and control of:
   Power (input-side and load-side)
   Environment (ambient temperature, humidity, atmosphere, vibration, etc.)

Energy consumption metering

Programmable emergency shutdown (of the DC PDU 111).

Figure 2C:
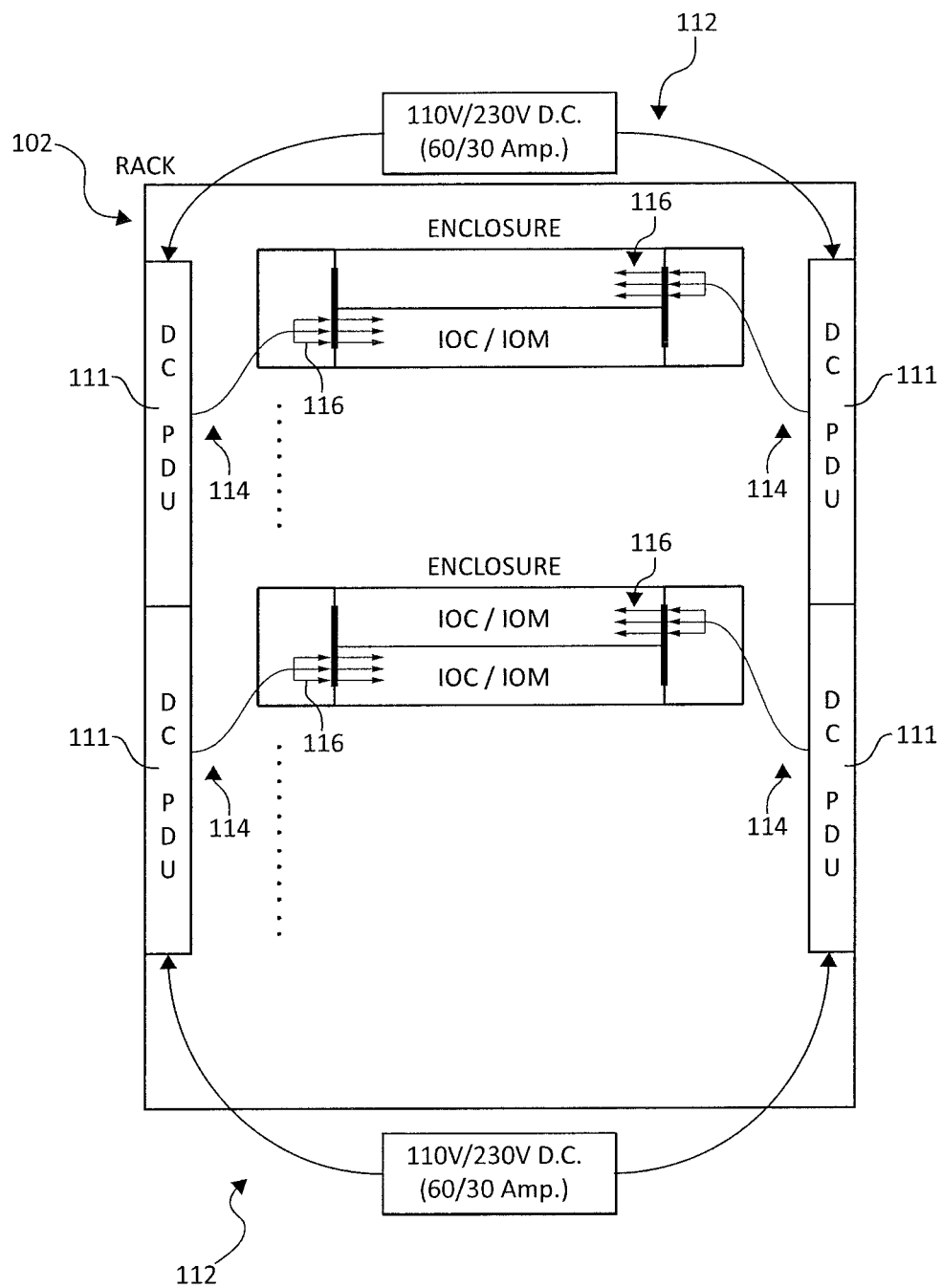
FIG. 2C is a simplified block diagram of a rack in accordance with one embodiment.

FIG. 2C is a simplified block diagram showing components within rack 102 in accordance with one embodiment. As can be seen in FIG. 2C, rack 102 includes multiple enclosures 104 and multiple DC PDUs 111. Each of the DC PDUs 111 receives a first DC power output 112 (e.g., 110 volts (V) DC and 60 amperes (Amp) or 230V DC and 30 Amp)) and provides a second DC power output 114 to ITE in enclosures 104. The second DC power output 114 is provided to the ITE via DC mating connectors 116.

Figure 2D:
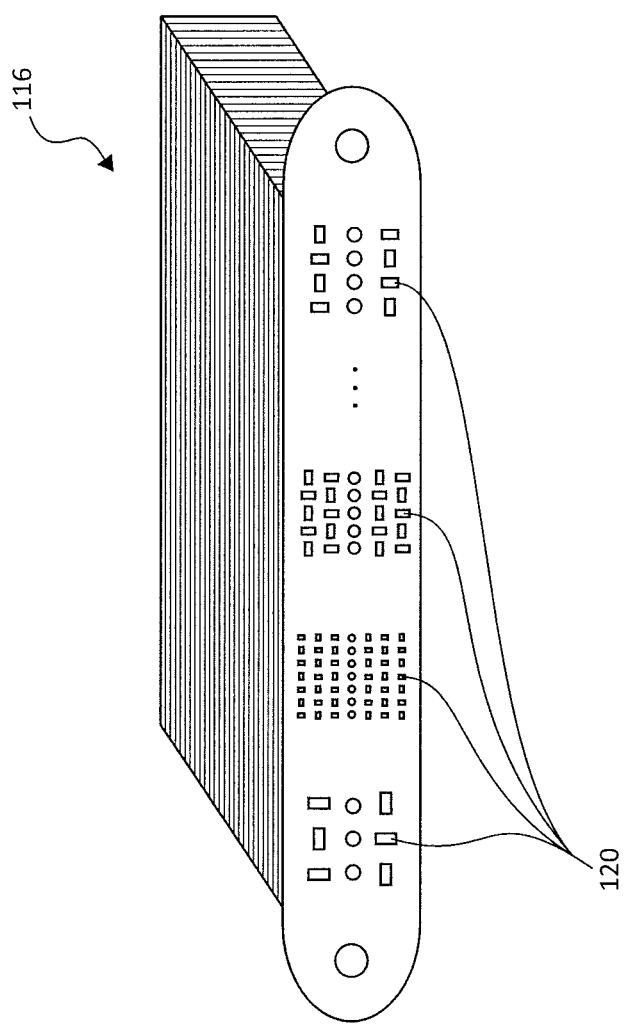
FIGS. 2D-2I are simplified block diagrams that together illustrate direct current mating connectors in accordance with one embodiment.
Figure 2E:
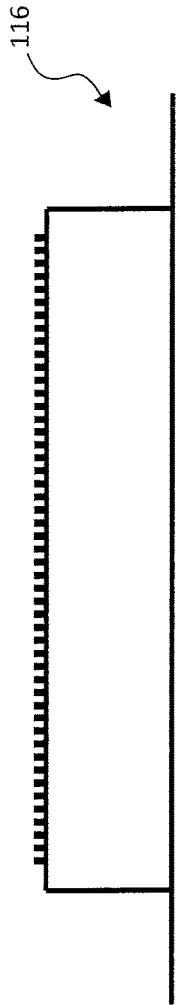
Figure 2F:
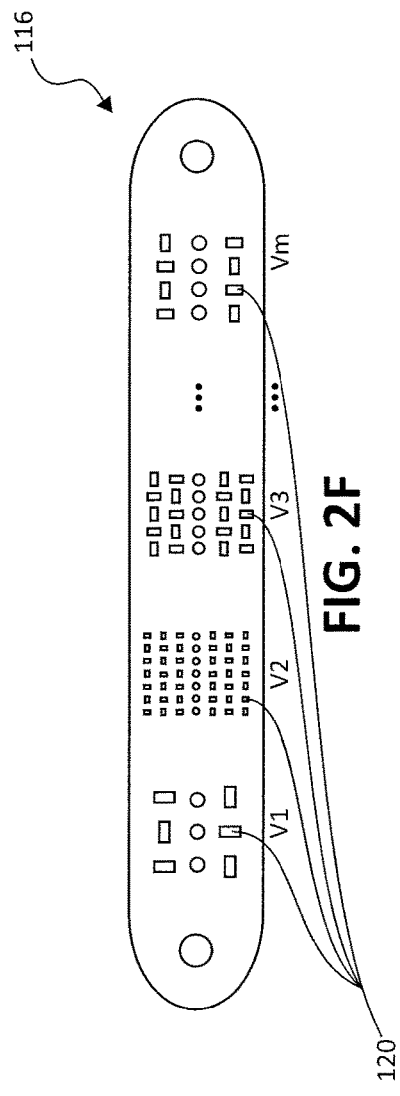
Figure 2G:
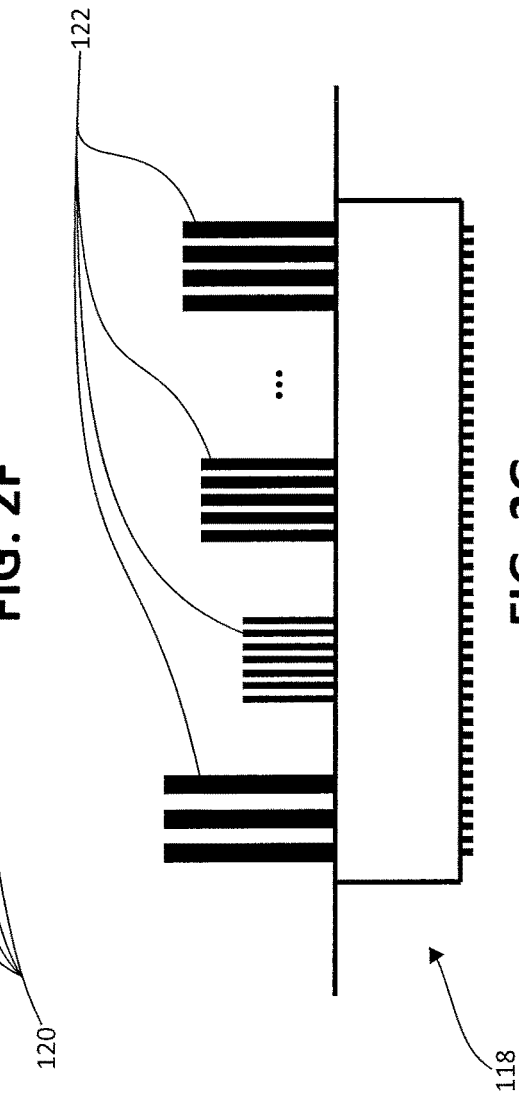

FIGS. 2D-2I illustrate different views of female DC mating connectors 116 and male DC mating connectors 118 in accordance with an embodiment of the disclosure. FIGS. 2D, 2E and 2F illustrate isometric, top and front views, respectively, of female DC mating connector 116. As can be seen in FIGS. 2D and 2F, female DC mating connector 116 includes a plurality of sets of grooves 120, with each set of grooves providing a connection for a different one of the range of second DC voltage outputs (V1, V2, . . . , Vm) 114. FIG. 2G illustrates a top view of male DC mating connector 118. As can be seen in FIG. 2G, male DC mating connector 118 includes a plurality of sets of pins 122 that are configured to fit into corresponding grooves 120 in female DC mating connector 116, and therefore FIG. 2F is also a front view of male DC mating connector 118. It should be noted that DC mating connector 118 may have pins 122 of same or different shapes and/or sizes for different DC outputs.

Figure 2I:
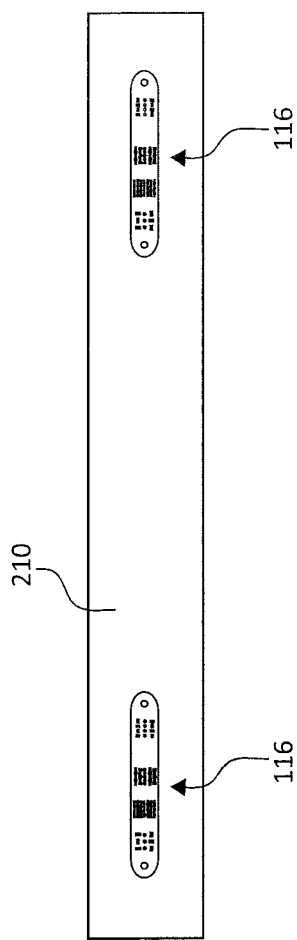
Figure 2H:
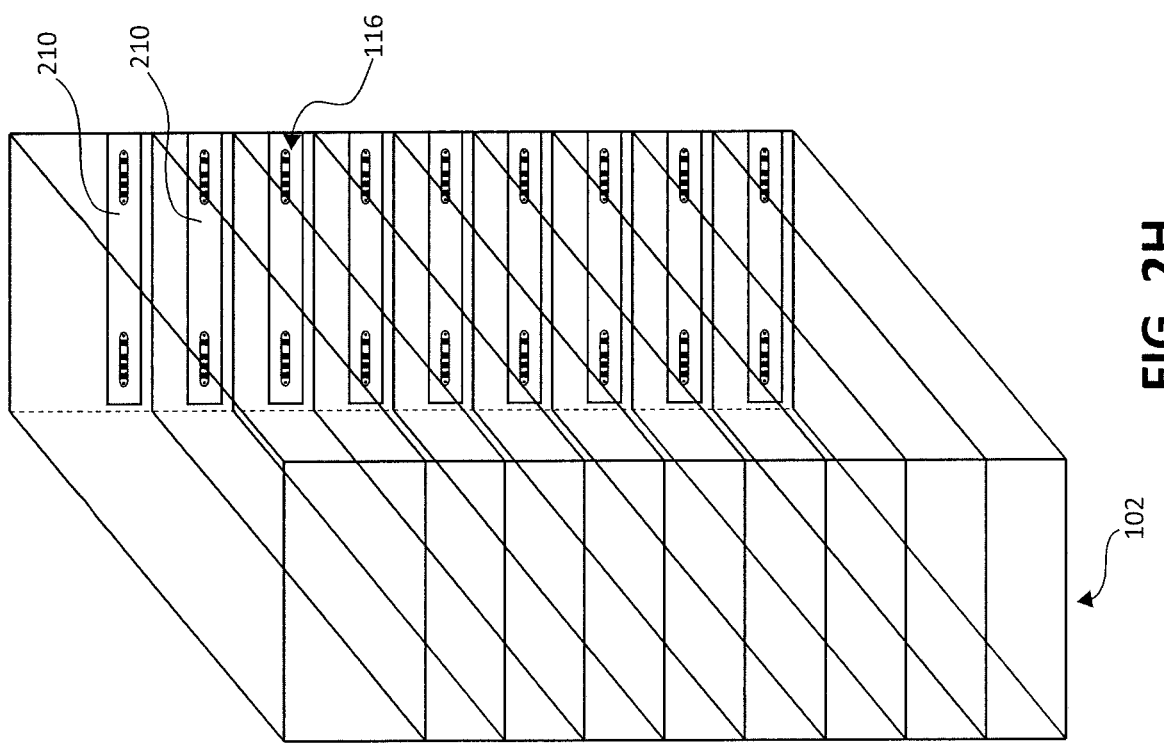

As indicated above, DC mating connectors 116 and 118 may be used for powering up the ITE from the DC-PDU 111 inside rack 102. FIGS. 2H and 2I together illustrate an example of how female DC mating connector 116 may be installed inside rack 102. In the embodiment of FIGS. 2H and 2I, female DC mating connectors 116 are installed onto crossbar supports 210, which may be removably coupled (e.g., semi-permanently coupled) to portions of rack 102. Female DC mating connectors 116 may be coupled to crossbar supports 210 by any suitable fasteners (e.g., screws and/or nut-bolt combinations).

The ITE may slide in along slide-rails (not shown) and "mate" with the female DC mating connectors 116 via male DC mating connectors 118 built into the ITE. In some embodiments (such as the embodiment shown in FIGS. 2H and 2I), multiple female DC mating connectors 116 are included per crossbar support 210, and several crossbar supports 210 are included inside the rack 102 to power up several ITE.

As noted above, the female and male DC mating connectors 116 and 118 have provisions for the multiple second DC output voltages (V1, V2, V3, . . . Vm) 114 for various components of the ITE. Further, each second DC output voltage (e.g., V1) has multiple+(DC positive) and − (DC negative) terminals fabricated out of suitable material with appropriate properties (size, cross-section-thickness, asymmetry) and mechanism(s) (e.g., latch, spring-load-release, etc.) to:

Balance current flow

Assure stable and sparkless fitment

Reduce/eliminate disconnect-sparking

Reduce corrosion

Prevent reverse-insert connections.

Figure 3:
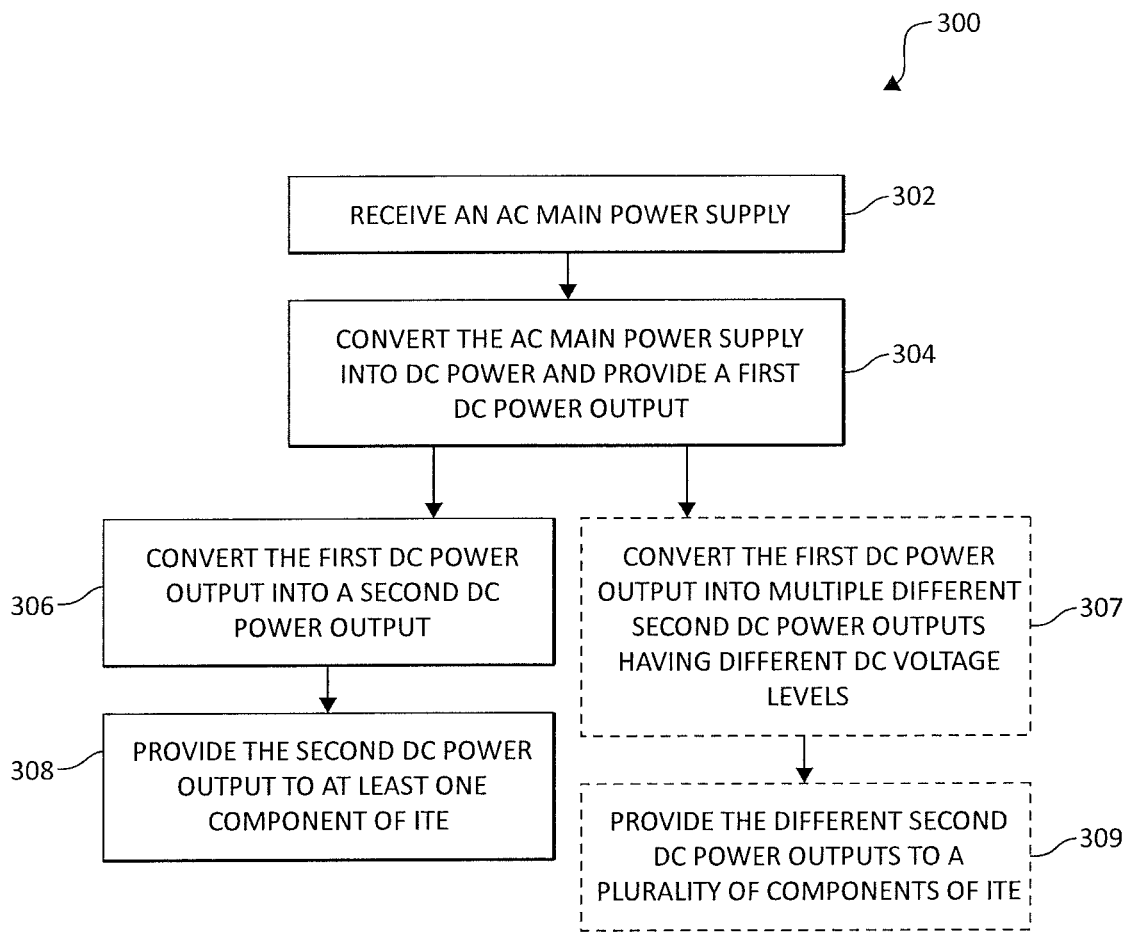
FIG. 3 is a flowchart of a method embodiment.

FIG. 3 is a flowchart of a data center power distribution method 300 in accordance with one embodiment. The method includes receiving an AC main power supply in a data center at 302. At 304, the AC main power supply is converted into DC power and a first DC power output is provided. At 306, the first DC power output is converted into a second DC power output, which may have different DC voltage levels (shown at 307). At 308, the second DC power output is provided to at least one component of ITE in the data center, or different second DC power outputs are provided to a plurality of components of ITE in the data center at 309.

The embodiments described above in connection with FIGS. 1-3 have several advantages over power distribution systems in which there is double power conversion from DC to AC in a UPS and from AC back to DC in the front-end power supply. The advantages include:

1. Savings from a reduction in components/materials
   a. Elimination of an inverter unit in the UPS (e.g., DC UPS 108) provides savings in terms of cost, power-loss and cooling. Further, there is a reduction in harmonics in the system due to one less DC to AC inversion.
   b. Changes in the electrical wiring connecting the UPS (e.g., DC UPS 108) to banks of rack PDUs (e.g., DC PDUs 111) have certain advantages. First, wires with smaller cross sections (which may weigh less and cost less) may be used for DC power distribution. Since the power distribution is DC, reactive AC power losses are eliminated. AC losses due to skin effect and proximity effect are also eliminated. Further, problems from magnetic fields (e.g., electromagnetic interference) associated with AC are eliminated. Additionally, DC power distribution helps in mitigation of overall build-up of harmonics.
   c. Elimination of components used for conversion from AC back to DC from the chassis/enclosures. Front-end power supplies convert AC to DC via switched mode power supplies (SMPS). This is yet another AC to DC conversion with component costs, power losses, heat generation and acoustics from SMPS fans, which are eliminated by using DC PDUs. It should be noted that board-level layouts and/or designs of the ITE in the chassis/enclosure may remain the same when DC PDUs replace front-end power supplies that convert AC to DC.
2. Space savings in the UPS
   a. Elimination of the DC to AC inverter component results in space savings in the UPS, thereby enabling the use of a relatively small DC UPS. This contributes to overall space and cost savings, cooling load reduction and power efficiency at the data center level.
3. Space savings in the chassis/enclosure that remains the same size when DC PDUs replace front-end power supplies that convert AC to DC. In such a chassis/enclosure, the empty space (previously occupied by front-end power supplies that convert AC to DC) is valuable real estate that may be repurposed to provide the following:
   a. Increased drive density (by including more HDDs into the empty space)
      For sub-1M TPI HDD chassis/enclosures
         Chassis/enclosures achieving Drive Densities>25/RU
         Since chassis input power is handled outside of the chassis/enclosure (e.g., in the DC PDUs), the electrical re-design of the chassis circuits for the added HDD load should be minimal
      and/or
   b. Increased inter-HDD space (from, for example, almost 0 inter-HDD or inter-drive space in systems having front-end power supplies that convert AC to DC to, for example, about 5 millimeters of inter-drive space in the embodiments of FIGS. 1-3), thus allowing CCFs with fans running at lower speeds
For sub-1M TPI HDD chassis/enclosures
This results in savings in electrical power, reduced vibration and acoustic noise, better airflow and reduced cooling load
For 1M TPI HDD chassis/enclosures
This implies increased throughput, better servo-system stability and increased life for 1M TPI HDDs (especially for HDDs near the CCFs).

The above-disclosed subject matter is to be considered illustrative, and not restrictive, and the appended claims are intended to cover all such modifications, enhancements, and other embodiments, which fall within the true scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A system comprising:
a direct current uninterruptible power supply (DC UPS) configured to receive an alternating current (AC) power input and to provide a first DC power output; and
a power distribution unit (PDU) comprising at least one DC-DC converter, a load balancing unit coupled between DC mating connector outlets and the at least one DC-DC converter, and a microcontroller coupled to the load balancing unit,
wherein the at least one DC-DC converter is configured to:
receive a first DC power output from the DC UPS;
convert the first DC power output into multiple different second DC power outputs, each different second DC power output having a different DC voltage level for supplying power to different components of a plurality of components of information technology equipment via the DC mating connector outlets; and
wherein the load balancing unit and the microcontroller control, balance and sequence a distribution of the different second DC power outputs having the different DC voltage levels to the DC mating connector outlets connected to the plurality of components of information technology equipment.

2. The system of claim 1 and wherein the DC UPS is directly connected to the PDU by an electrical connector.

3. The system of claim 1 and wherein the DC UPS comprises a step down rectification and regulation component and a battery bank.

4. The system of claim 1 and wherein the PDU is configured to provide the multiple different second DC power outputs to the different components of information technology equipment that are within an enclosure.

5. The system of claim 4 and wherein each of the DC mating connector outlets is coupled to a crossbar support in a rack that includes the enclosure.

6. A method comprising:
receiving an alternating current (AC) main power supply in a data center;
converting the AC main power supply into direct current (DC) power and providing a first DC power output;
converting, by at least one DC-DC converter, the first DC power output into multiple different second DC power outputs, each different second DC power output having a different DC voltage level for supplying power to different components of a plurality of components of information technology equipment via DC mating connector outlets; and
controlling, balancing and sequencing, by a load balancing unit and a microcontroller, a distribution of the different second DC power outputs having the different DC voltage levels to the DC mating connector outlets connected to the plurality of components of information technology equipment.

7. The method of claim 6 and further comprising providing the multiple different second DC power outputs to the different components of information technology equipment that are within an enclosure.

8. The method of claim 7 and further comprising coupling the DC mating connector outlets to a crossbar support in a rack that includes the enclosure.

9. An apparatus comprising:
a first device; and
a power distribution unit (PDU) comprising at least one direct current (DC)-DC converter, a load balancing unit coupled between DC mating connector outlets and the at least one DC-DC converter, and a microcontroller coupled to the load balancing unit,
wherein the at least one DC-DC converter is configured to:
receive a first DC power output from the first device;
convert the first DC power output into multiple different second DC power outputs, each different second DC power output having a different DC voltage level for supplying power to different components of a plurality of components of information technology equipment via the DC mating connector outlets; and
wherein the load balancing unit and the microcontroller control, balance and sequence a distribution of the different second DC power outputs having the different DC voltage levels to the DC mating connector outlets connected to the plurality of components of information technology equipment.

10. The apparatus of claim 9 and wherein the first device comprises a DC UPS that provides the first DC power output.

11. The apparatus of claim 10 and wherein the DC UPS is directly connected to the PDU by an electrical connector.

12. The apparatus of claim 10 and wherein the DC UPS comprises a step down rectification and regulation component and a battery bank.

13. The apparatus of claim 10 and wherein the PDU is configured to provide the multiple different second DC power outputs to the different components of information technology equipment that are within an enclosure.

14. The apparatus of claim 13 and wherein each of the DC mating connector outlets is coupled to a crossbar support in a rack that includes the enclosure.

15. The system of claim 9 and wherein each of the DC mating connector outlet includes multiple connections with each different connection providing the different DC voltage level for supplying power to different components of the plurality of components of information technology equipment.

16. The apparatus of claim 14 and wherein the plurality of components of information technology equipment ITE within the enclosure comprises a plurality of data storage devices.

* * * * *

UNITED STATES PATENT AND TRADEMARK OFFICE
CERTIFICATE OF CORRECTION

PATENT NO. : 10,847,994 B2
APPLICATION NO. : 16/355504
DATED : November 24, 2020
INVENTOR(S) : Hemant Mohan et al.

It is certified that error appears in the above-identified patent and that said Letters Patent is hereby corrected as shown below:

In the Claims

Column 8, Claim 15, Line 56, please replace the word "outlet" with the word --outlets--.

Column 8, Claim 16, Line 62, please delete the word "ITE".

Signed and Sealed this
Twelfth Day of January, 2021

Andrei Iancu
*Director of the United States Patent and Trademark Office*